(12) United States Patent
Wang (10) Patent No.: US 6,475,915 B1
(45) Date of Patent: Nov. 5, 2002

(54) ONO ETCH USING CL2/HE CHEMISTRY (75) Inventor: Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/420,687

(22) Filed: Oct. 19, 1999

(51) Int. Cl.[7] .............................................. H01L 21/302
(52) U.S. Cl. ...................... 438/689; 438/706; 438/710; 438/723; 438/724
(58) Field of Search .............................. 438/710, 689, 438/706, 723, 724

(56) References Cited

U.S. PATENT DOCUMENTS

| | | | |
|---|---|---|---|
| 4,799,991 A | * | 1/1989 | Dockrey ..................... 156/643 |
| 5,106,767 A | * | 4/1992 | Comfort et al. ............... 437/31 |
| 5,451,537 A | * | 9/1995 | Tseng et al. .................... 437/52 |
| 5,453,156 A | * | 9/1995 | Cher et al. ................ 156/643.1 |
| 5,952,246 A | | 9/1999 | Wang et al. |
| 6,074,956 A | * | 6/2000 | Yang et al. .................. 438/721 |
| 6,159,794 A | * | 12/2000 | Yang et al. .................. 438/257 |

* cited by examiner

*Primary Examiner*—Robert Kunemund
*Assistant Examiner*—Vanessa Perez-Ramos
(74) *Attorney, Agent, or Firm*—Amin & Turocy, LLP (57) ABSTRACT

An etch process utilizing $Cl_2$/He chemistry for use in a silicon integrated circuit manufacturing process. The etch is a highly nitride selective, anisotropic etch. The process according to an aspect of the invention comprises the steps of etching through a top silicon dioxide layer of an ONO layer with a Cl2/He plasma etch at a first power, and subsequently etching the underlying nitride layer at a substantially lower second power.

9 Claims, 7 Drawing Sheets

ONO ETCH USING CL2/HE CHEMISTRY

BACKGROUND OF THE INVENTION

Field of the Invention

The invention relates to silicon integrated circuit technology, and, more particularly, to an anisotropic etch process using $Cl_2$/He chemistry in the manufacture of a silicon integrated circuit device.

Etching processes are often employed in the manufacture of silicon integrated circuit devices.

Silicon integrated circuit manufacturing processes typically begin with a single-crystal silicon (Si) workpiece. The workpiece is subjected to a series of steps carried out in a particular order. Those steps serve to appropriately layer and configure the wafer workpiece with desired semiconductor pathways to create a useable integrated circuit device. The ordering of the steps, and the parameters for those steps, dictate the resulting integrated semiconductor circuitry achieved from the manufacturing process.

The term "etching" describes a variety of techniques by which material is removed uniformly, or in the delineation of a pattern, from a wafer during manufacture of a silicon integrated circuit device. Etching is often a step or steps in the manufacturing process. Etching steps serve both to "clean" the surface of a wafer to remove defects and/or foreign debris and to shape or "profile" the wafer as appropriate for the manufacturing process. In any case, the goal in etching is removal of portions of material from a wafer as desired for the particular application.

There are several types or classifications of etching processes. Of these different types or classifications, there has been no single type or classification of etch which is best or preferred in all circumstances. Typically, a particular type or classification of etch is only suitable for a particular application or class of applications. It would be an improvement in the technology if an etch process were developed that exhibits favorable aspects in several or a number of varied applications.

The first category of types or classifications of etching processes deals with the particular etchant which effects the etch, i.e., the medium which causes the removal. Generally, there are two types of etchants: chemical and physical. In the case of chemical etchants, a chemical is used to dissolve or react with materials of the wafer to be etched away. Chemical etching may occur by any of several different processes. The simplest process is dissolution of a material to be etched from the wafer in a solvent without any change in the chemical nature of the dissolved material. Other chemical etching processes involve one or more chemical reactions in which the product formed from the reaction is soluble in the etching medium or may be carried away from the surface by the medium. Various types of reactions which may be involved are oxidation-reduction, complexation, and vaporization. In these processes, the parameters of the etching steps, such as temperature and pressure in which the process occurs, may be important factors to the success of the etch.

The second type of etchants are physical etchants. In physical etching processes, material is selectively removed from the wafer by momentum transfer from a rapidly moving inert projectile. Ion milling is one form of physical etching. Another form of physical etching is sputtering. Both of these techniques require the formation of a gas discharge producing high-velocity ions. The high-velocity ions bombard the wafer in selective locations causing removal of desired materials from the wafer. These processes are referred to as plasma-assisted processes because characteristics of the particular gas discharge may be important to the etch outcome.

Etching processes are also typed or classified by the degree of anisotrophy of the etch. Anisotropic etching occurs in a single direction, whereas isotropic (the opposite of anisotrophic) etching occurs in all directions. Typically, in an etch, amorphous materials of uniform composition will be etched isotropically, whereas many crystalline materials will be etched both isotropically and anisotrophically. The degree of anisotrophy of etching usually will depend upon the crystallographic orientation of the material being etched and the particular etching reagent used. Where a polishing action is desired from the etch, isotropic etching is preferred to achieve a structureless, or smooth, surface. If structural shaping is the objective of the etch, however, anisotropic conditions are preferred. The degree of anisotrophy of an etch depends on a variety of parameters, such as the particular etchant, the temperature, the pressure, the selectivity of the etchant for particular materials of the wafer, and others.

Etching processes may be even further typed or classified as wet or dry etchings. In wet etching processes, etching takes place in a liquid. In dry etching processes, etching takes place in a gas. A variety of factors impact wet or dry etching processes, such as the particular liquid or gas medium, temperatures, processes, and other factors.

Selectivity of etching processes is another factor important in classifying or typing etch processes. Selectivity, in fact, is one of the most important factors affecting the effectiveness of and outcome of an etching process. Selectivity refers to differences in etch rates between different materials, or between compositional or structural variations of the same materials. Most etching processes must be controllably selective because the material to be etched is usually part of, or in close proximity or relationship with, a wafer that consists of several material components. Selectivity in etching depends upon a number of factors, such as choice of etching technique, etchant composition, temperatures, pressures, and constraints of the system and materials etched.

The foregoing types or classifications of etching processes are not absolute, as many etching processes may include combinations and variations on the categories. Nevertheless, the presently most used etching processes can be generally classified by reference to these various categories. Because each category has particular advantages/disadvantages and characteristics in particular applications, it would be beneficial to have an etching process which works effectively in a variety of conditions and applications.

In the manufacture of silicon integrated circuit devices by the aforesaid etching processes and other manufacturing techniques, there often occurs an undesired result: The actual geographic configuration of the product device differs from the design geographic configuration. This discrepancy between actual and design is many times the result of inaccuracies and ineffectiveness of etching processes in delivering desired results. As previously described, there can be numerous factors important to the result obtained from an etching process, including for example, anisotropy of the etch, inability of equipment to maintain optimum conditions of sterility and tolerance, pressures, temperatures, chemistry of etchant compositions, and others. These factors and others may result in dimensional and compositional changes in the actual device from the design device. Those changes can lead to functional and operational problems. Designers and manufacturers of silicon integrated circuit devices must understand that these changes in dimensions will occur in an etch and must compensate therefor in the design and manufacturing process. Of course, it is preferable to limit the possibility of these changes whenever possible. Those who practice the art, therefore, continually search for still better and improved methods to maintain desired wafer geographic configuration or "profiles" and other aspects of wafer quality.

The present invention provides for an improved etching process which has, in tests, proven to be particularly effective in substantially maintaining desired profiles upon etching. Further, the etch process has proven to substantially improve characteristics of the etch, such as selectively and anisotrophy. Even further, the present etch process provides these improvements and yet maintains generally desirable characteristics of etch processes, for example, etch rate and other conditions necessary for a commercially useable etch process.

BRIEF SUMMARY OF THE INVENTION

According to an aspect of the invention, a method of manufacturing a silicon integrated circuit device is provided, comprising etching an ONO layer with $Cl_2$/He chemistry. According to a further aspect of the invention, the method may further comprise the step of depositing the ONO layer. The method may also further comprise the step of etching a portion of said ONO layer with $Cl_2$/He chemistry.

According to a further aspect of the invention, an ONO etch process is provided, comprising of: etching an ONO layer disposed upon a silicon wafer with a plasma at a first power, the plasma including chlorine and helium atoms, the ONO layer comprising a top silicon dioxide layer, a nitride layer, and a bottom silicon dioxide layer; etching the nitride layer with the plasma at a second power that is substantially less than the first power after breaking through the top silicon dioxide layer; and, stopping further plasma etching after reaching the bottom silicon dioxide layer.

The invention offers distinct advantages over the prior art. For example, critical dimension control is improved, profile control is improved, and residual silicon dioxide thickness after the etch is more uniform in thickness due to the high selectivity of the $Cl_2$/He chemistry. The improved profile control contributes to reduced bird's beak oxidation. These and other advantages of the invention are apparent from the detailed description that follows.

BRIEF DESCRIPTION OF SEVERAL VIEWS OF THE DRAWINGS

For a more complete understanding of the present invention and for further objects and advantages thereof, reference may now be had to the following description in conjunction with the accompanying drawings, in which.

DETAILED DESCRIPTION OF THE INVENTION

The following detailed description primarily addresses preferred use of the present invention in manufacture of a CMOS circuit. Those skilled in the art will readily recognize, however, that the invention may be satisfactorily employed with a wide variety of processes and devices and under varied conditions, as well as in numerous other applications. The following detailed description also primarily addresses a preferred embodiment of the present invention. Those skilled in the art will, nevertheless, readily recognize that alternative aspects and embodiments of the invention are possible. All those other applications for and embodiments of the invention are hereby expressly included in, and form a part of, the invention. U.S. patent application Ser. No. 08/146,928 filed Nov. 3, 1993, entitled "Nitride Selective, Anisotropic $Cl_2$/He Etch Process", now abandoned, is directed to related subject matter and is fully incorporated herein by reference.

In general, the invention provides a new, improved etch process for use in manufacturing a silicon integrated circuit device. In particular, the invention process is a new plasma etch approach using $Cl_2$/He chemistry. The use of $Cl_2$/He chemistry in plasma etching provides an anisotropic etch process, like that of $C_2F_6$ etch chemistry, and a high nitride to oxide selectivity, comparable to that of $SF_6$/He or $SF_6$/$O_2$ etch chemistry. As used herein, the terms chlorine, helium, and $Cl_2$/He chemistry includes the specified atoms, and ions thereof in the plasma state.

Figure 1:
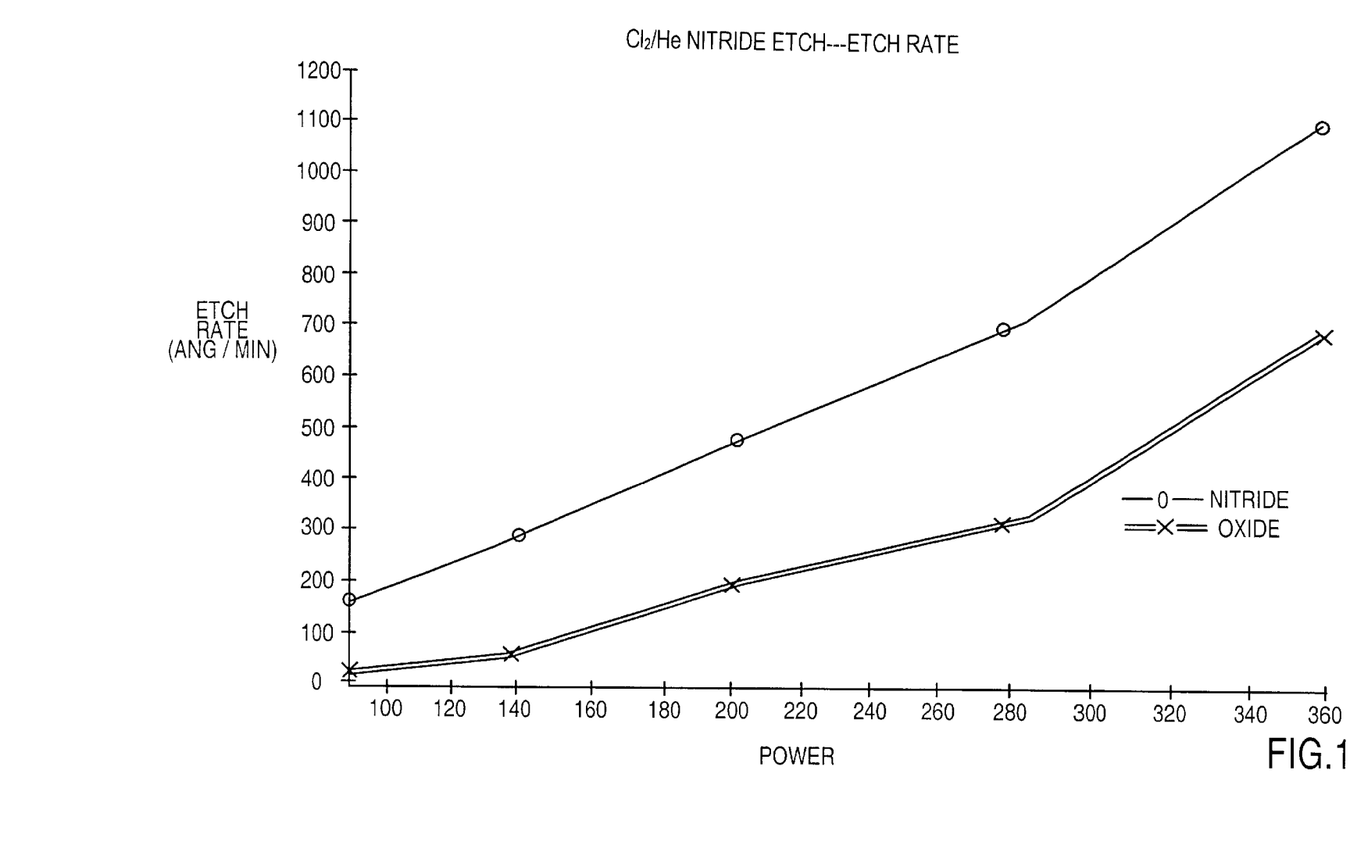
FIG. 1 is a graph showing variation of etch rate of a $Cl_2$/He etch at increasing power.
Figure 2:
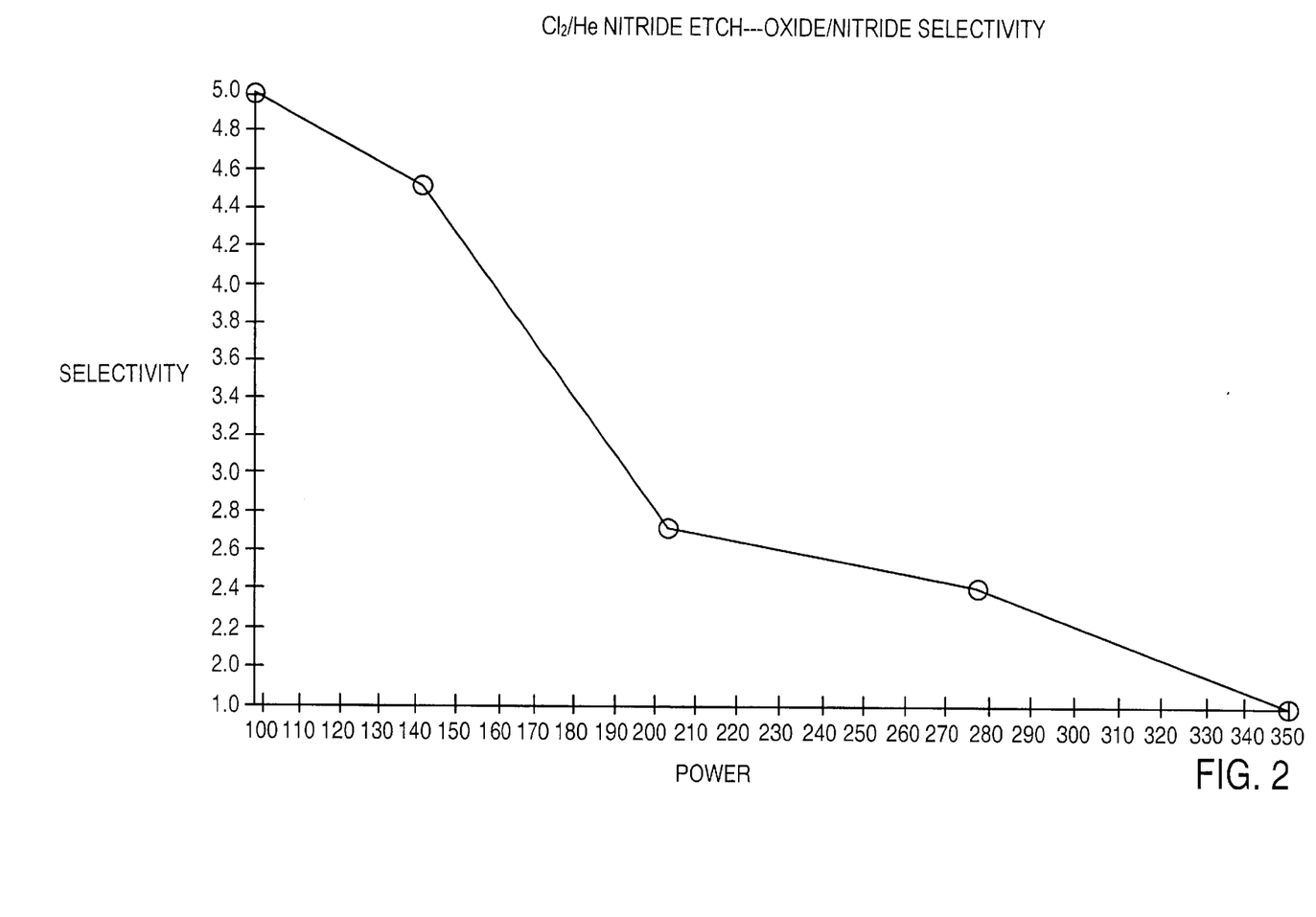
FIG. 2 is a graph showing variation of silicon dioxide/silicon nitride selectivity of a $Cl_2$/He etch at increasing power.
Figure 3:
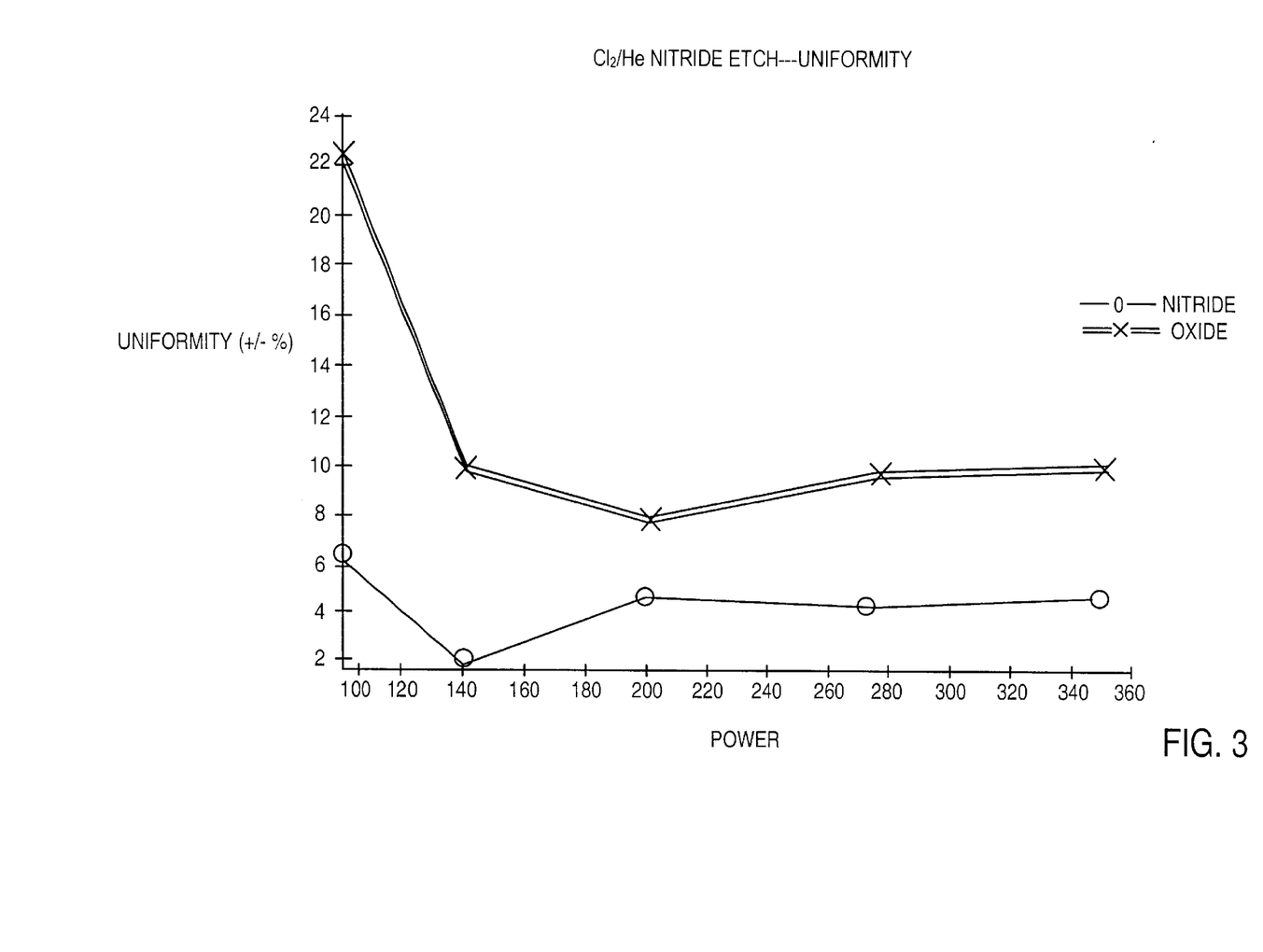
FIG. 3 is a graph showing variation of silicon dioxide uniformity and silicon nitride uniformity of a $Cl_2$/He etch at increasing power.

One concern with $Cl_2$/He chemistry is the nitride etch rate, since the etch rate, in any event, must be high enough so that a reasonable wafer throughput can be obtained from the process. Since power is the most critical parameter for both etch rate and selectivity, a study was performed with $Cl_2$/He chemistry comparing etch rate and selectivity. Results of the study are shown in FIGS. 1–3. As shown in FIG. 1, by varying power from 100 watts to 350 watts, nitride etch rate changed from 161 Å/minute to 1150 Å/minute. As shown in FIG. 2, nitride-to-oxide selectivity decreased from 5.0 to 1.8 as power increased from 100 watts to 350 watts. Further, as shown in FIG. 3, both nitride and oxide uniformity increased when the power was close to 100 watts. Based on the performance charts of FIGS. 1–3, it was determined that a preferred $Cl_2$/He chemistry etch process would be performed at a power of about 140 watts. At that power, it has been found that the $Cl_2$/He etch results in nitride uniformity of about +/−5% and oxide uniformity of around +/−10%. The etch may be performed at a power of 80 watts to 300 watts.

The following discussion describes certain steps and stages in the two (i.e., prior art and present) exemplary silicon integrated circuit manufacturing processes. These exemplary processes are intended solely as examples of the steps and stages of those type processes. The present invention $Cl_2$/He etch process is highly effective and suitable for use in a variety of silicon integrated circuit manufacturing processes at a number of steps and stages in those processes, for example, in a source and drain etch process. In order to better understand the objects and advantages of the present $Cl_2$/He etch process, however, the following discussion proceeds, first, with a description of an exemplary prior art technology manufacturing process not utilizing the $Cl_2$/He etch process of the present invention and further not using a nitride spacer in the process (see FIGS. 4–7) and, second, with a description of an exemplary manufacturing process utilizing the $Cl_2$/He etch process of the present invention and, in particular, a preferred use of the present invention etch process in conjunction with a nitride spacer (see FIGS. 8–13).

Figure 4:
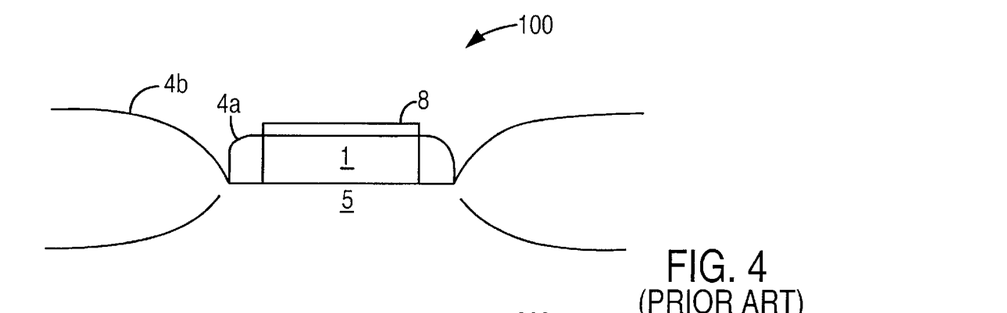
FIG. 4 is an exemplary, cross-sectional, partial cutaway view through a silicon wafer workpiece in an early stage of a prior art silicon integrated circuit chip manufacturing process, after growth of a silicon dioxide layer, application of a first polycrystalline silicon, and topping with a silicon nitride-silicon dioxide.

Referring first to FIGS. 4–7 for discussion of an exemplary prior technology process, and, in particular, to FIG. 4, an exemplary, simplified, partial, cross-section through an intermediate stage workpiece 100 in a prior art manufacturing process to obtain a desired silicon integrated circuit device is illustrated. This intermediate stage workpiece 100 is formed beginning with a silicon wafer 5. The silicon wafer 5 is topped with a select configuration of silicon dioxide 4a, 4b ("oxide") and polycrystalline silicon 1 ("poly") to yield the intermediate stage workpiece 100 having a cross-section as shown, in part, in FIG. 4. The poly 1 line (i.e., configuration) on the wafer 5 of about 1500 Å thickness may be defined, for example, by a photoresist patch process followed by a $C_2F_6$ etch. Numerous other procedures to obtain the intermediate stage workpiece 100 are possible and will be apparent to those skilled in the art.

Still referring to FIG. 4, the configuration of oxide on the intermediate stage workpiece 100 includes an approximately uniform layer of oxide 4b of about 1300 Å on the wafer which tapers towards the poly 1 to form a ridge of oxide, the bitline oxide 4a, which abuts the poly 1. Atop the poly 1 is deposited a Nitride/Oxide layer 8. The Nitride/Oxide layer 8 is a silicon dioxide-silicon nitride layered arrangement of respective thicknesses of the layers of about 120 Å and 190 Å. Of particular interest in this particular view of the intermediate stage workpiece 100 is that only a slightly negative slope 12 results in the poly 1 and bitline oxide 4a. This negative slope 12 is due to deformation of the profile of the intermediate stage workpiece 100 upon deposition of the poly 1. As will hereafter become more fully apparent, the negative slope becomes increasingly greater through the prior art process and is a primary cause of the trench and stringer problems resolved by the present invention. A wide variety of methods may be employed to obtain this intermediate stage workpiece 100. Those skilled in the art will readily know and appreciate the particular configuration of the intermediate stage workpiece 100, and alternatives and substitutes therefor, and the various methods and steps thereof to derive this and those other particular configurations.

Figure 5:
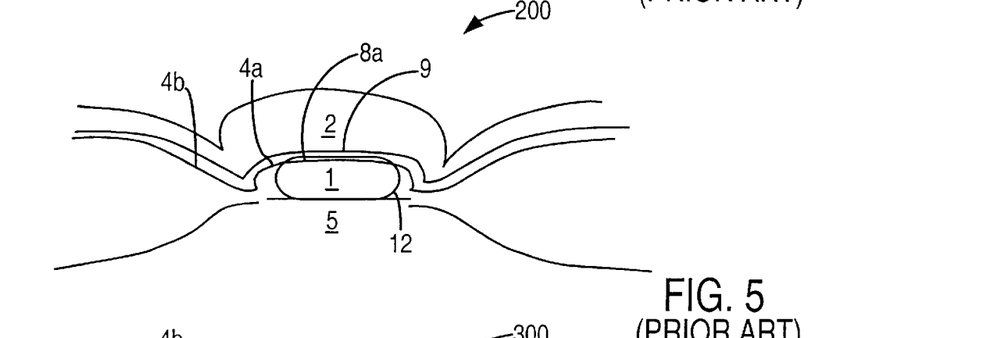
FIG. 5 is the same view as FIG. 4 of the workpiece of FIG. 4 in a prior art manufacturing process after an etch step and a step of layering the device with a silicon dioxide-silicon nitride-silicon dioxide and a second polycrystalline silicon layer.

Referring now to FIG. 5, a second stage workpiece 200 from the exemplary prior art process is illustrated. In this second stage workpiece 200, the intermediate stage workpiece 100 has been subjected to an etch for example, a phosphoric acid wet etch, to remove the nitride of the nitride/oxide layer 8 (shown in FIG. 4) leaving a residual oxide layer 8a and then layered on the surface thereof by a silicon dioxide-silicon nitride-silicon dioxide ("ONO") layer 9 and a second polycrystalline silicon 2 ("poly") film. The deposition of this poly 2 causes certain further deformation of the profile of the intermediate stage workpiece 100. Note the increasing negative slope 12a of the poly 1 and bitline oxide 4a. As previously mentioned, this deformation causing the significant negative slope 12a is a primary cause of the trench and stringer problems, heretofore described and more fully discussed hereafter, as found in the devices obtained from prior art manufacturing processes. This second stage workpiece 200 is seen to also comprise the silicon wafer 5, topped by the poly 1 and oxide 4. Atop the poly 1 is the ONO layer 8. The poly 2 film is seen to cover the entire workpiece 200.

Figure 6:
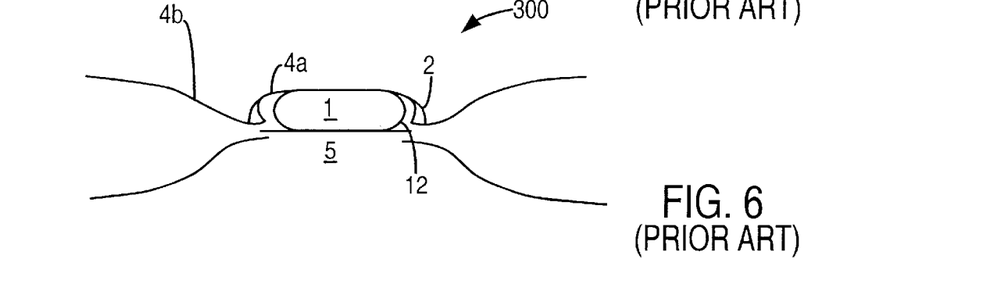
FIG. 6 is the same view as FIG. 5 of the workpiece of FIG. 5 in a prior art manufacturing process after a step of etching, by a prior art etch process, the second polycrystalline silicon layer, the silicon dioxide-silicon nitride-silicon dioxide, and portions of the silicon dioxide.

Next referring to FIG. 6, a third stage workpiece 300 from the exemplary prior art manufacturing process is shown. This third stage workpiece 300 is obtained by etching the second stage workpiece 200 by a prior technology etch process. In the prior technology etch, substantially all of the poly 2 layer has been removed, except for small bitline remnants of poly 2 along the edges of the poly 1. Further, the prior technology etch removes the ONO layer 8 and portions of the oxide 4a, 4b. As will be hereafter more readily understood, the resulting bitline areas of poly 2 result in the stringer problems heretofore described. Those problems result, in particular, because of the negative slope 12a which results to the poly 1 and oxide 4a upon deposition of the poly 2 layer.

Figure 7:
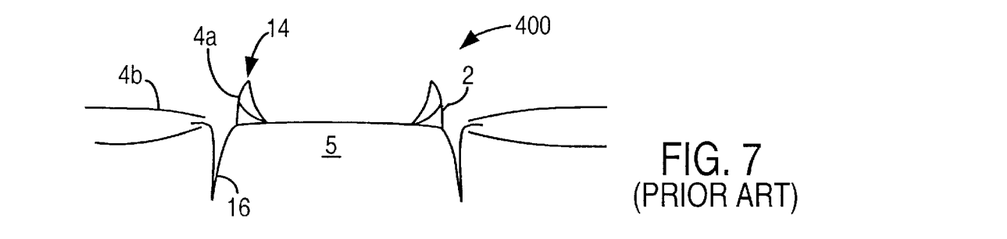
FIG. 7 is the same view as FIG. 6 of the workpiece of FIG. 6 in a prior art manufacturing process after a step of self-align etching, by a prior art etch process, in which all of the first polycrystalline silicon and much of the silicon dioxide have been removed by over-etch, illustrating resulting stringers of the second polycrystalline silicon topped by silicon dioxide and trenches in the silicon wafer.

Referring now to FIG. 7, a fourth stage work piece 400 from the exemplary prior art process is shown. This fourth stage workpiece 400 results from a prior technology etch of the third stage workpiece 300 (shown in FIG. 6). That prior technology etch, which etch is termed a self-align etch due to the particular stage in the manufacturing process, is employed to remove substantially all of the poly 1 and much of the oxide 4a, 4b from particular portions of the workpiece 300. In efforts to remove the poly 1, an over-etch is necessary. That over-etch removes substantially all of the poly 1 (not seen in FIG. 7 but shown in FIG. 6) from certain portions, but leaves stringers 14 formed of the remaining poly 2 and oxide 4a due to the negative slope 12a (shown in FIG. 6). That negative slope 12a (shown in FIG. 6) causes the oxide 4a to top the poly 2, creating the stringer 14. The over-etch required to remove essentially all of the poly I from portions of the workpiece 300 (shown in FIG. 6) results in trenches 16 along the thin bitline oxide 4a area adjacent what was poly I before the prior technology self-align etch (FIG. 6).

Still referring to FIG. 7, as previously alluded to, the stringers 14 and trenches 16 result in numerous problems in the final product workpiece from this exemplary manufacturing process using prior technology etch procedures. In particular, stringers 14 may cause shorts in the product device since any remaining poly 2 may inappropriately connect with electrical flow path of the device, for example, through the silicon wafer 5 or the poly 1 or poly 2 which have selectively not been etched away from particular portions of the workpiece. Trenches 16 may cause high silicon resistance through the silicon wafer 5 in the areas of the trenches 16 since the path for electrical flow through the silicon wafer 5 is reduced due to the reduced cross-sectional area of the silicon wafer 5 at the trenches 16. These problems have been described with reference to a particular configuration, i.e., the workpiece 100, 200, 300, 400, but, as those skilled in the art will readily appreciate, a variety of other configurations and arrangement may result in and/or cause these same or similar trench and stringer problems. Though this particular workpiece 100, 200, 300, 400 has been described in referring to the prior art manufacturing process, it is to be understood that this particular workpiece 100, 200, 300, 400 is only an example of a workpiece which may be derived from prior art manufacturing processes which employ the prior technology etch procedures. These same or similar problems of stringers and trenches can occur in many other configurations and arrangements found in the prior technology devices and processes. The present invention $Cl_2$/He etch process can serve to resolve the same or similar problems in many other prior technology devices and processes as well.

Figure 8:
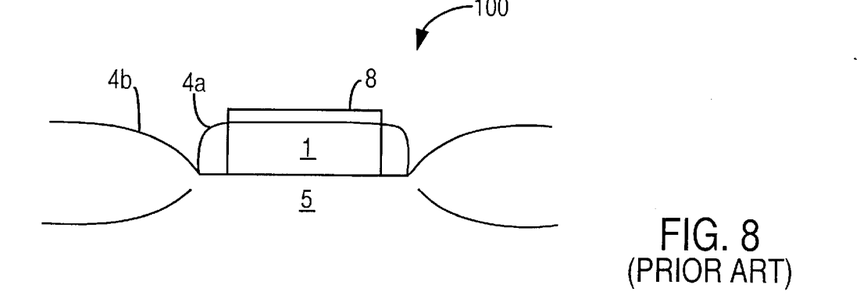
FIG. 8 is an exemplary, cross-sectional, partial cutaway view through a silicon wafer workpiece (identical to that of FIG. 4) in an early stage of a silicon integrated circuit chip manufacturing process utilizing the present invention $Cl_2$/He etch process, after growth of an oxide layer, application of a first polycrystalline silicon, and topping with a silicon nitride-silicon dioxide.

Next referring to FIG. 8, which is identical to FIG. 4, an exemplary, simplified, partial, cross-section through a silicon wafer 5 from an exemplary manufacturing process which uses the present invention $Cl_2$/He etch process is shown. This intermediate stage workpiece 100 of FIG. 8 is an example workpiece with which the present invention etch process will be effective. It is to be understood that this intermediate stage workpiece 100 is merely an example of a beginning workpiece, and the invention process is effective with all other configurations and arrangements in which the same or similar problems of trenches and stringers may occur, and in many other situations as well.

Figure 9:
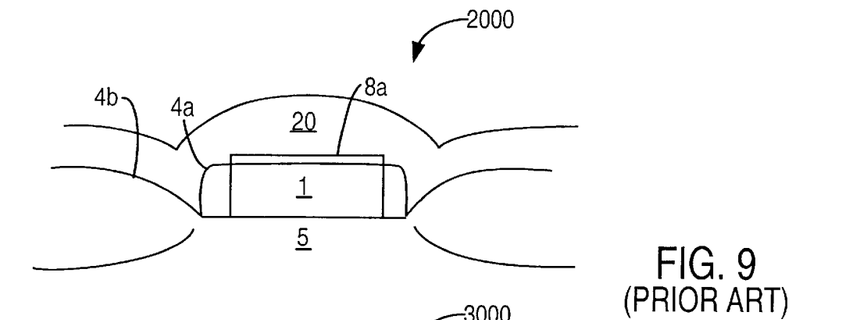
FIG. 9 is the same view as FIG. 8 of the workpiece of FIG. 8 in a manufacturing process utilizing the present invention $Cl_2$/He etch process, after an etch step and a step of depositing a silicon nitride spacer atop the wafer.

Now referring to FIG. 9, a new second stage workpiece 2000 from an exemplary process using the present invention $Cl_2$/He etch process is illustrated. In this new second stage workpiece 2000, the intermediate stage workpiece 100 has been etched, for example, by a phosphoric acid wet etch, to remove the nitride of the Nitride/Oxide layer 8 (shown in FIG. 8) leaving only oxide 8a and then layered on the surface thereof by a silicon nitride 20 ("nitride") layer, which serves as a spacer. Use of the nitride 20 layer, i.e., spacer, in conjunction with the present $Cl_2$/He etch process, in this manner is preferred; however, it is to be expressly understood that use of the nitride 20 is described herein only as an example manufacturing process in which the present $Cl_2$/He etch process is effective. Continuing now to discuss the preferred use of this nitride 20 in conjunction with the present $Cl_2$/He etch process, it may be noted that this nitride 20 layer when formed atop the intermediate stage workpiece 100 does not result in additional deformation of the profiles of the intermediate stage workpiece 100. For instance, the poly 1 profile remains essentially the same as in the intermediate stage workpiece 100, and the oxide 4 does not protrude beneath the poly 1. This may be better understood by comparing the prior art in FIGS. 5–7 with the present invention in FIGS. 9–12. The poly 1 and bitline oxide 4a in FIGS. 5–7 showing the prior art have a negative slope 12a differing from the profile of the starting workpiece 100 (shown in FIG. 4). On the other hand, the poly 1 and bitline oxide 4a of the present invention in FIGS. 9–12 retain the same slope 12 and, thus, profile, as in the starting workpiece 100 (shown in FIG. 8). As will be more fully described later, it is very important as this overcomes the problem of stringers and trenches experienced from the prior art manufacturing processes not utilizing the present $Cl_2$/He etch process.

Figure 10:
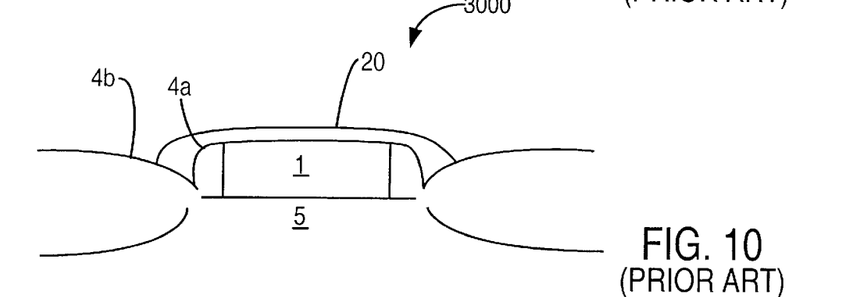
FIG. 10 is the same view as FIG. 9 of the workpiece of FIG. 9 after a step of etching, by the present invention $Cl_2$/He etch process, the nitride spacer and portions of the silicon dioxide.

Next referring to FIG. 10, a new third stage workpiece 3000 from the exemplary process using the present invention $Cl_2$/He etch process is shown. This new third stage workpiece 3000 is obtained by etching, by the $Cl_2$/He etch process, the new second stage workpiece 2000. In that etch, much of the nitride 20 layer is removed except for bitline nitride 20 (the "nitride spacer") portions adjacent to the poly 1 and atop the bitline oxide 4a. Though not shown in detail, a thin layer of oxide also remains. As will become apparent, because the poly 1 profile did not change upon application of the nitride spacer 20, this $Cl_2$/He etch leaves the nitride spacer 20 filling valleys between the oxide film 4b and bitline oxide 4a adjacent to poly 1. This is important in maintaining the ability to, in subsequent $Cl_2$/He etching steps, remove essentially all of the poly 2 and poly 1 from particular portions of the workpiece 3000, without any resulting trenches.

Figure 11:
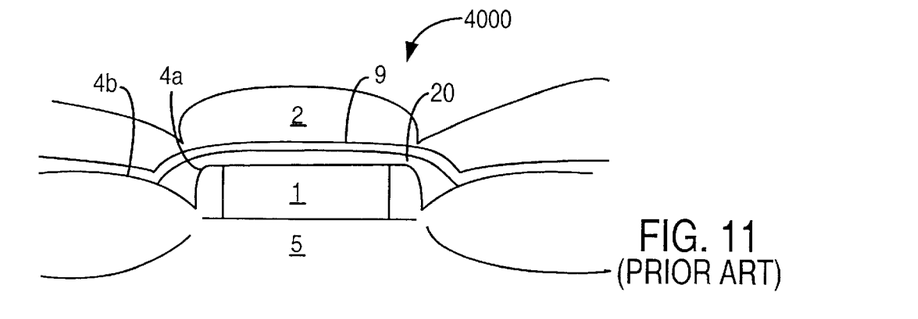
FIG. 11 is the same view as FIG. 10 of the workpiece of FIG. 10 in a manufacturing process utilizing the present invention $Cl_2$/He etch process, after a step of layering the device with a silicon dioxide-silicon nitride-silicon dioxide and a second polycrystalline silicon layer.

Next referring to FIG. 11, a new fourth stage workpiece 4000 from the exemplary process using the present invention $Cl_2$/He etch process is illustrated. In this new fourth stage workpiece 4000, the thin oxide layer atop the new third stage workpiece 3000 after the etch has been stripped and the new third stage workpiece 3000 of FIG. 10 has been layered with an ONO layer 9 and a poly 2 film. The difference between this exemplary manufacturing process (employing the present $Cl_2$/He etch and nitride spacer 20) and the exemplary prior art manufacturing process (employing a prior technology etch process, not a $Cl_2$/He etch, and absent a nitride spacer 20) is that, in the present invention exemplary process, the poly 2 is layered on the wafer 5 only after the nitride spacer 20 is thereon deposited and etched by a Cl₂/He etch step. In this manner, the nitride spacer 20, upon being etched by the present invention Cl₂/He etch process, can serve to protect the wafer 5 from, and eliminate the possibility of poly 2 or poly I remaining on selected portions of the workpiece after, a subsequent etch. As a result of the remaining nitride spacer 20, which results due to the steps of depositing of the nitride 20 layer and then subsequent etching by the Cl₂/He etch process, the possibility of damage to the silicon wafer 5 from another subsequent etch, in particular, if that etch is also a Cl₂/He etch, is eliminated or substantially diminished.

Figure 12:
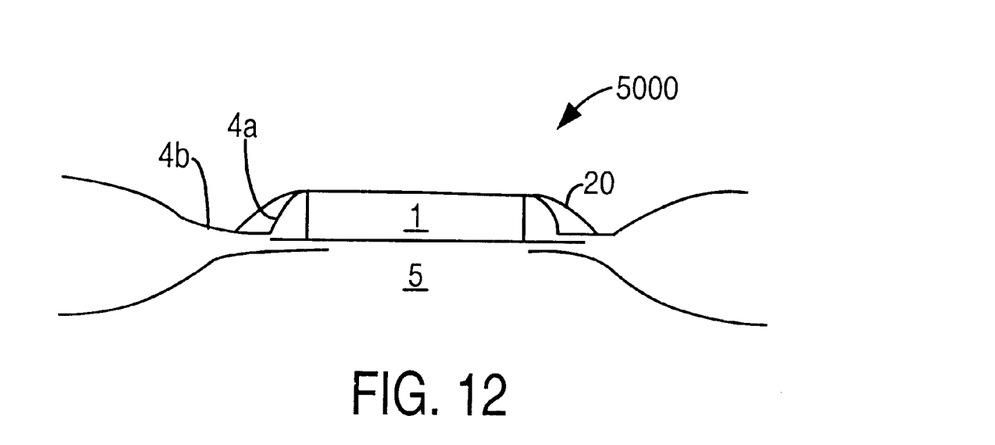
FIG. 12 is the same view as FIG. 11 of the workpiece of FIG. 11 after a step of etching, by the present $Cl_2$/He etch process, of the second polycrystalline silicon layer and the silicon dioxide-silicon nitride-silicon dioxide.
Figure 13:
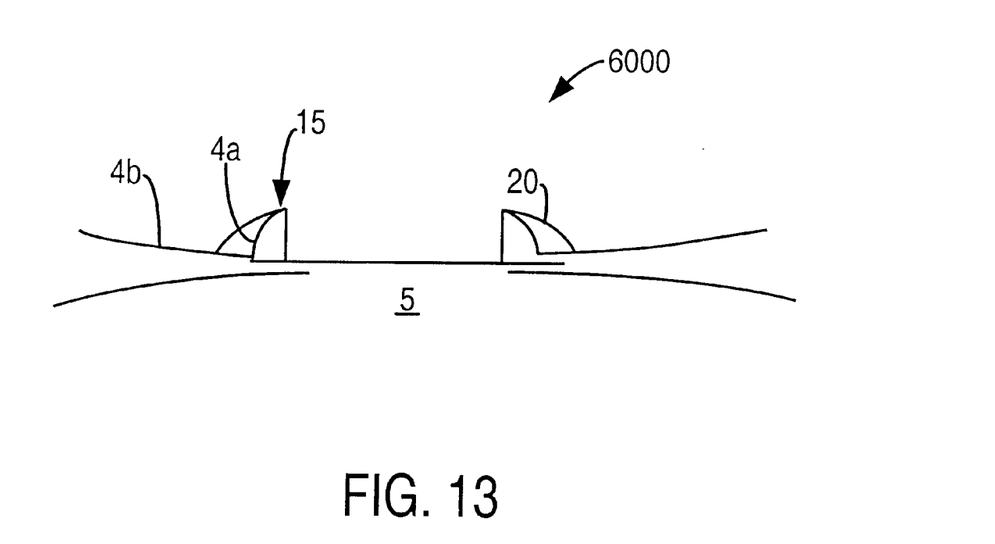
FIG. 13 is the same view as FIG. 12 of the workpiece of FIG. 12 after a step of etching, by the present invention $Cl_2$/He etch process, the first polycrystalline silicon, illustrating resulting stringers of silicon dioxide topped by the silicon nitride spacer and lack of trench damage in the silicon wafer.

Referring now to FIG. 12, a new fifth stage workpiece 5000 from the exemplary process using the present Cl₂/He etch is shown. This new fifth stage workpiece 5000 results from a Cl₂/He etch of the new fourth stage workpiece 4000 (shown in FIG. 11). In that Cl₂/He etch, substantially all of the poly 2 layer has been removed except for small bitline remnants along the edge of the poly 1. That Cl₂/He etch also removes the ONO layer 8 and portions of the nitride spacer 20 and oxide 4b. Note that the bitline oxide 4a is not removed as a result of the Cl₂/He etch because the bitline oxide 4a remains protected by the nitride spacer 20. Also, because the nitride spacer 20 does not, on application to the workpiece, cause deformation of the profile resulting in a negative slope 12a of the poly 1 and bitline oxide 4a as in the prior art (see FIG. 6), poly 2 is fully removed from desired portions of the workpiece by the present invention Cl₂/He etch (compare FIG. 10 and the prior art in FIG. 6). The Cl₂/He etch of the present invention, when employed in conjunction with a nitride spacer 20, in forming the new fifth stage workpiece 5000, thus, protects the bitline oxide 4a and also prevents deformation of the profile of the workpiece 5000. Referring now to FIG. 13, a new sixth stage workpiece 6000 from the exemplary process using the present invention Cl₂/He etch process is shown. This new sixth stage workpiece 6000 corresponds to the fourth stage workpiece 400 (shown in FIG. 7) from the prior art manufacturing process which does not utilize the present invention Cl₂/He etch process. Due, however, to the use of the present Cl₂/He etch process in conjunction with a nitride spacer 20, the self-align etch to remove the poly 1 from particular portions of the workpiece 5000 (shown in FIG. 12) removes essentially all of the poly 1 without resulting stringers 14 or trenches 16 (both exhibited in the prior art and illustrated in FIG. 7). This is the result because a nitride spacer 20 essentially takes the place of the poly 2 in the prior art (see FIGS. 5–7). Because the present Cl₂/He etch is particularly nitride selective, after such an etch only the nitride spacer 20 and portions of the oxide 4a form a bitline stringer 15 of oxide 4a topped by nitride 20. This stringer 15, i.e., oxide 4a topped by nitride 20, does not cause the problems presented by the stringers in devices obtained from prior technology manufacturing processes. Both oxide 4a and nitride 20 are insulators and so shorts will not occur in the final product device obtained from the exemplary process using the Cl₂/He etch of the present invention, as may occur in the product devices from prior technology manufacturing processes employing some other type of etch. Shorts occur in the product devices from the prior technology manufacturing processes due to remnants of poly 2 in the form of stringers remaining after the prior technology etches. The stringers 15 of oxide 4a topped by nitride 20 in the product obtained from the exemplary manufacturing process using the present Cl₂/He etch, unlike the stringers of oxide 4a topped by poly 2 from the prior art manufacturing process (see FIG. 7), protect the silicon wafer 5 during the over-etch. Because the stringers 15 in the product device from the exemplary manufacturing process using the present Cl₂/He etch, i.e., those stringers being formed of oxide 4a topped by nitride 20, protect the wafer during over-etch, the possibility of trenches, as found in the product devices from the prior art manufacturing processes (FIG. 7), is eliminated. The elimination of trenches improves the uniformity of resistance through the silicon wafer 5.

Now more specifically discussing the particular Cl₂/He etching procedures, and, in particular, the procedures employed when using a nitride spacer 20 in conjunction with the Cl₂/He etch, by reference to FIGS. 9 and 10, in conjunction, it is seen that the workpiece 2000 is etched by the present Cl₂/He etch process to obtain the workpiece 3000. A three-step etch process utilizing Cl₂/He chemistry is preferred when using a nitride spacer 20. The etch parameters of the preferred etch are as follows:

| Process Parameters | Step 1 | Step 2 | Step 3 | Step 4 | Step 5 | Step 6 | Step 7 | Step 8 |
|---|---|---|---|---|---|---|---|---|
| Pressure (MTORR) | *700 | *700 ± 100 | 450 | 450 | 450 ± 100 | 450 ± 100 | 500 | 0 |
| RF Top (WATTS) | 0 | *400 ± 100 | 0 | 0 | 27 ± 100 | 140 ± 100 | 0 | 0 |
| GAP (CM) | 1.25 | 1.25 ± .2 | 0.7 | 0.7 | 0.70 ± .2 | 0.70 ± 2 | 1.35 | 1.35 |
| CL2 Flow (SCCM) | 0 | 0 | 70 | 70 | 70 ± 20 | 70 ± 20 | 0 | 0 |
| O2 Flow (SCCM) | 0 | 0 | 0 | 0 | 0 | 0 | 0 | 0 |
| He Flow (SCCM) | 0 | 0 | 70 | 70 | 70 ± 20 | 70 ± 20 | 180 | 0 |
| C2F6 Flow (SCCM) | 200 | 200 ± 50 | 0 | 0 | 0 | 0 | 0 | 0 |
| SF6 Flow (SCCM) | 0 | 0 | 0 | 0 | 0 | 0 | 0 | 0 |
| STABILITY/TIME | STABILITY | TIME | TIME | STABILITY | TIME/ENDPT | O/ETCH | TIME | RECIPE |
| WAIT (MIN:SEC) | N/A | *0:30 ± :30 | 0:20 | N/A | *2:00 ± 30 | 60% | 0:05 | N/A |
| Process Parameters | Step 1 | Step 2 | Step 3 | Step 4 | Step 5 | Step 6 | Step 7 | Step 8 |
| END POINT DELAY 59 SEC | | | | | | | | |
| NORM 10 SEC | | | | | | | | |
| TRIGGER 95% | | | | | | | | |

As may be noted, the three primary steps of the etch are steps 2, 5 and 6. The first etch step, a nitride selective, anisotropic Cl₂/He etch step, serves the purpose of miscellaneous oxide (not shown) breakthrough and removes contamination or oxide (not shown) which has formed on top of the workpiece 2000. The second Cl₂/He etch step is a main etch which is accomplished at a fast etch rate and lower selectivity for removal of essentially all of the nitride spacer 20 layer, except for nitride spacer 20 which covers the bitline oxide 4a in the area adjacent the edges of the poly 1 and ONO 9. This main etch is an anisotropic Cl₂/He etch which can maintain the nitride spacer 20 width so that the thin oxide 4a area abutting the poly 1 and ONO 9 layers can be protected. The third etch step, an over etch is performed at low power to provide a high nitride to oxide selectivity etch, and, due to this particular over etch, the bitline oxide 4a thickness can be maintained and oxide 4a loss will be minimal. As can readily be appreciated, though preferred, these steps and the parameters thereof may be varied and combined with other steps and procedures in innumerable ways to accomplish similar or different objectives, depending on the application.

Continuing to discuss the etching procedures by reference now to FIGS. 10, 11, and 12, in conjunction, once the aforedescribed main etch with $Cl_2$/He chemistry is completed, ONO 9 and poly 2 are deposited atop the workpiece 3000. The poly 2, together with the ONO 9, tops the resulting workpiece 4000 by layers of approximately uniform thickness. The poly 2 layer 10 conforms generally to the surface geographical features of the workpiece 4000. An over-etch step, termed a self-align etch, also utilizing the present nitride selective, anisotropic $Cl_2$/He etch, is then performed. This self-align etch using $Cl_2$/He chemistry is performed at a lower etch rate than the main etch to allow for higher selectivity of poly 2 to oxide.

When generally comparing the prior art silicon integrated circuit manufacturing process (FIGS. 4–7) to the exemplary process of the present invention (FIGS. 8–13) employing the $Cl_2$/He etch process, which in the preferred embodiment includes use of a nitride spacer 20, it is apparent that the preferred embodiment manufacturing process includes additional steps of a nitride spacer 20 layer deposition (FIG. 9) and several steps (e. g. three is preferred) of a highly nitride selective, anisotropic $Cl_2$/He (FIG. 10) etch which is the subject hereof. A variety of etch parameters may be followed in performing the present $Cl_2$/He etch, and the parameters described herein are intended only to illustrate the preferred embodiment of the $Cl_2$/He etch when employed in a typical silicon integrated circuit device manufacturing process. Though the $Cl_2$/He etch process has been described herein as part of an "exemplary" manufacturing process, that particular manufacturing process and the stages at which the $Cl_2$/He etches are performed are only given as an example. The present $Cl_2$/He etch may be effective in a wide variety of applications, whether or not a nitride spacer is also employed in the applications. All such applications in which the $Cl_2$/He etch of the present invention may be used are included as a part of the invention.

In the product workpiece 5000 obtained from the exemplary manufacturing process using the present invention $Cl_2$/He etch process, in conjunction with a nitride spacer 20, only about 10% signal drop was observed at the nitride spacer 20 and bitline oxide 4a interface. Further a very repeatable end point was received with 95% trigger point. It was discovered that about a 50 Å oxide 4a was lost with 20% over-etch, and the profile of the workpiece 5000 with resulting nitride spacer 20 is substantially as shown in FIG. 12. As may be noted, use of the present $Cl_2$/He etch process, when employed in conjunction with use of a nitride space 20, improves the profile through the manufacturing process. No significant negative slope (e.g., compare prior art slope 12a to slope 12) is observed at the poly 1 edge due to the bitline oxidation and the following ONO strip process. The poly 1 retains only a slightly negative slope 12 with use of the $Cl_2$/He etch process, in conjunction with a nitride spacer 20, and the requirement in the prior art process of an over-etch to remove poly 2 is eliminated or at least substantially diminished. In the self-align etch using $Cl_2$/He chemistry, the use of a nitride spacer 20 serves to protect the thin bitline oxide 4a area during the etch, and trench problems are, thus, not found in the product device 5000.

Figure 14:
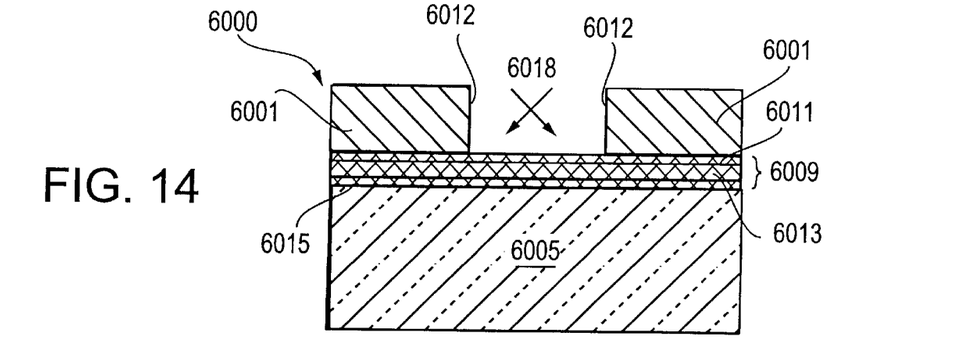
FIG. 14 is an exemplary, cross-sectional, partial cutaway view through a silicon wafer workpiece in an early stage of a silicon integrated circuit chip manufacturing process utilizing the present invention $Cl_2$/He etch process according to a further aspect of the invention.

Referring now to FIGS. 14–17, a process utilizing a $Cl_2$/He etch is presented according to a further aspect of the invention. Referring now specifically to FIG. 14, a workpiece 6000 is presented comprising a silicon wafer 6005, a silicon dioxide—silicon nitride—silicon dioxide (ONO) layer 6009 disposed upon the silicon wafer 6005, and a mask layer 6001 disposed upon the ONO layer 6009. The ONO layer 6009 comprises a first silicon dioxide layer 6015, a nitride layer 6013 on the first silicon dioxide layer 6015, and a second silicon dioxide layer 6011 on the nitride layer 6013. The mask layer is preferably formed from photoresist, but may also be a hard mask, for example polysilicon or silicon nitride, as the needs of the particular process may require. An opening is formed in the mask layer 6001 according to methods known in the art and defines sidewalls 6012 that are preferably, but not necessarily, vertical. The workpiece 6000 is formed starting with the silicon wafer 6005 followed by oxidation, chemical vapor deposition, masking, and etching processes well known in the art. A pocket implant is performed of n-type or p-type atoms as, indicated by arrows 6018. The pocket implant is performed according to methods well known in the art.

Figure 15:
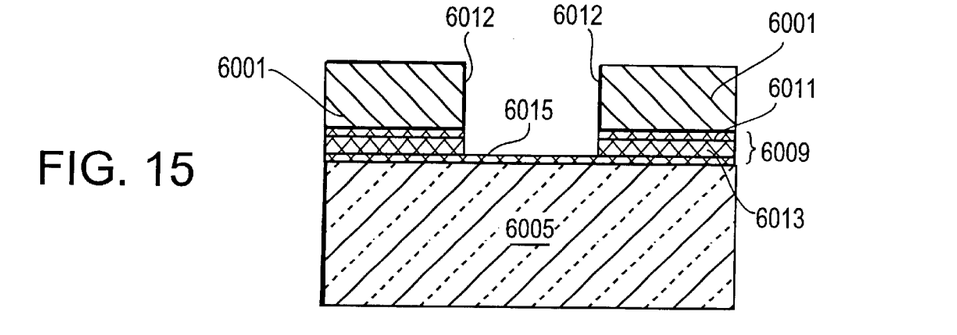
FIG. 15 is the FIG. 14 workpiece at a subsequent stage of processing according to the invention after partial etch of the ONO layer.
Figure 16:
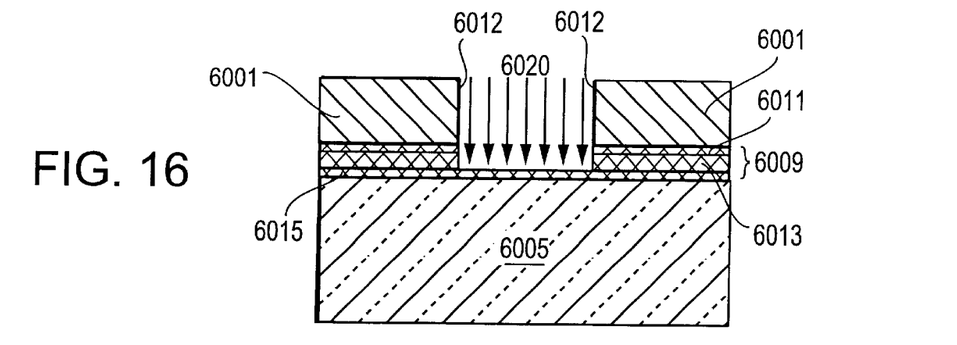
FIG. 16 is the FIG. 14 workpiece at a subsequent stage of processing according to the invention showing the bitline implant.

Referring now to FIG. 15, the next step in the process is to perform an ONO etch using a $Cl_2$/He plasma. The process begins with a high first power etch to break through the second silicon dioxide 6011 layer of the ONO layer 6009. Upon breaking through the second silicon dioxide layer 6011, power is reduced and etching proceeds with a high selectivity for nitride at a lower second power. This etch continues through the nitride layer 6013 until it reaches the first silicon dioxide layer 6015 of the ONO layer 6009. At that point, etching is stopped leaving the first silicon dioxide layer 6015. A bitline implant is performed, as indicated by arrows 6020 in FIG. 16, according to methods well known in the art. The mask layer 6001 shields other areas from the implant.

Figure 17:
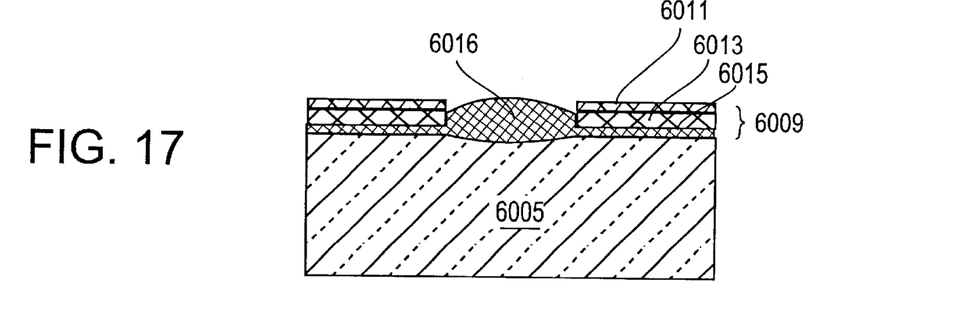
FIG. 17 is the FIG. 14 workpiece at a subsequent stage of processing according to the invention showing the bitline oxidation.

Referring now to FIG. 17, the mask layer 6001 is removed, and the bitline area 6014 is oxidized, thereby forming a thick bitline oxide layer 6016. A polysilicon floating gate (not shown) may be formed over the ONO layer 6009, another dielectric layer (not shown) may be formed over the floating gate, and a polysilicon control gate (not shown) may be formed over the dielectric layer and the floating gate, according to methods known in the art. Alternatively, the ONO layer may function as the floating gate as in, for example, a two-bit device. In such case, a polysilicon control gate is formed directly over the ONO layer.

Starting the etch with a high power while etching the second silicon dioxide layer 6011 provides a high degree of anisotropy which creates more vertical sidewalls and less tapering and/or undercut. Decreasing to a lower power while etching the nitride layer 6013 provides better control and also results in a more uniform residual first silicon dioxide layer 6015. The other benefits of $Cl_2$/He etch described herein are also realized.

Although described in relation to the exemplary embodiment presented in FIGS. 14–17, this aspect of the invention is directed to an ONO etch using a plasma prepared from a mixture including Cl and He, and it is not intended to limit the invention to the specific embodiments presented herein. Variations are evident to those having a skill in the art in light of the description provided herein, and any such variations are considered to fall within the purview of the invention. Integrated circuit devices and other products made the processes described herein also form a part of the invention, and may be implemented in computers and other devices for computation and/or control purposes. According to a further aspect of the invention, a method of making a computer is provided comprising preparing a silicon integrated circuit device by a process of the invention, and forming a computer comprising said silicon integrated circuit device.

Etching an ONO layer with $Cl_2$/He chemistry offers distinct advantages over the prior art. For example, critical dimension control is improved, profile control is improved, and residual silicon dioxide thickness after the etch is more uniform in thickness due to the high selectivity of the $Cl_2$/He chemistry. The improved profile control contributes to reduced bird's beak oxidation.

As is clearly seen, the present invention provides a new and improved etch process which overcomes many of the problems exhibited by the prior technology processes. The present invention is believed to be especially effective when conducted, configured and employed as described herein; however, those skilled in the art will readily recognize that numerous variations, substitutions, and alterations may be made in the invention process and its use, steps, and parameters to achieve substantially the same results as achieved by the embodiments and, in particular, the preferred embodiment, expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. An ONO etch process, comprising:
providing an ONO layer formed over a silicon wafer, the ONO layer comprising a first silicon dioxide layer underlying a silicon nitride layer, and a second silicon dioxide layer overlying said silicon nitride layer;
selectively etching said second silicon dioxide layer with a plasma at a first power, said plasma comprising chlorine and helium atoms, to expose the silicon nitride layer; and
selectively etching said nitride layer with said plasma at a second power less than said first power to expose said first silicon dioxide layer, whereby the first silicon dioxide layer is not etched.

2. The method of claim 1, further comprising depositing said ONO layer onto a silicon wafer.

3. The method of claim 1, wherein said etching is etching a portion of said ONO layer.

4. The method of claim 1, wherein said first power is 110 to 300 watts and said second power is 80 to 100 watts.

5. The method of claim 1, wherein selectively etching said second silicon dioxide layer at said first power greater than the second power facilitates a higher degree of anisotropy which creates more vertical sidewalls and less tapering of the second silicon dioxide layer.

6. The method of claim 1, wherein selectively etching said silicon nitride layer at said second power lower than said first power facilitates better control and a more uniform residual first silicon dioxide layer.

7. An ONO etch process, comprising:
initially forming a polysilicon gate structure on the silicon wafer;
forming a nitride spacer layer over the polysilicon gate structure;
etching the nitride spacer layer using a plasma comprising a $Cl_2$ and He chemistry to form a nitride bit line over the polysilicon gate;
forming an ONO layer over the nitride bit line, the ONO layer comprising a first silicon dioxide layer underlying a silicon nitride layer, and a second silicon dioxide layer overlying the silicon nitride layer;
selectively etching said second silicon dioxide layer with a plasma at a first power, the plasma comprising chlorine and helium atoms, to expose the silicon nitride layer; and
selectively etching said nitride layer with the plasma at a second power less than the first power to expose the first silicon dioxide layer, whereby the first silicon dioxide layer is not etched.

8. The method of claim 7, wherein said first power is 110 to 300 watts and said second power is 80 to 100 watts.

9. The method of claim 7, wherein etching the nitride spacer using a $Cl_2$ and He chemistry facilitates retention of the polysilicon gate structure profile and mitigates a sloped profile.

* * * * *